United States Patent [19]

Davis

[11] 4,441,073

[45] Apr. 3, 1984

[54] RESISTIVITY SENSOR SYSTEM FOR DETECTING FAULTS IN SEALED GAS-INSULATED ELECTRICAL APPARATUS

[75] Inventor: William D. Davis, Ballston Spa, N.Y.

[73] Assignee: Electric Power Research Institute, Inc., Palo Alto, Calif.

[21] Appl. No.: 218,785

[22] Filed: Dec. 22, 1980

[51] Int. Cl.³ .................... G01R 31/08; H02G 15/28; H01L 7/00

[52] U.S. Cl. .................................. 324/52; 174/11 R; 338/34

[58] Field of Search ................... 324/51, 52, 54, 65 R; 338/34; 340/632–634; 174/11 R; 73/27 R

[56] References Cited

U.S. PATENT DOCUMENTS

| 2,433,505 | 12/1947 | Bennett et al. | 174/11 R |
| 3,703,696 | 11/1972 | Browall et al. | 338/35 |
| 3,891,958 | 6/1975 | Wakabayashi | 338/34 X |
| 4,241,019 | 12/1980 | Nakatani et al. | 338/34 X |
| 4,249,126 | 2/1981 | McConnell | 324/52 |

FOREIGN PATENT DOCUMENTS

| 46-31414 | 9/1971 | Japan | 324/52 |
| 46-31415 | 9/1971 | Japan | 324/52 |
| 54-137644 | 10/1979 | Japan | 324/51 |
| 55-51347 | 4/1980 | Japan | 338/34 |
| 55-78235 | 6/1980 | Japan | 338/34 |

OTHER PUBLICATIONS

Perry, M. P., "*Fault Location in Gas Insulated Conductors Using Magnetic Sensors*", IEEE Trans. on Power Apparatus and Systems, vol. PAS-99, No. 4, Jul./Aug. 1980.

*Primary Examiner*—Gerard R. Strecker
*Attorney, Agent, or Firm*—Flehr, Hohbach, Test, Albritton & Herbert

[57] ABSTRACT

A resistivity sensor system for use with sealed, gas-insulated electrical apparatus. The system includes a resistivity sensor for placement within a housing of the electrical apparatus. The sensor itself includes an electrically insulating substrate, a pair of spaced-apart electrodes located on the substrate, and a polymer film in the space between the electrodes. The electrical resistivity across the polymer film changing significantly with the occurrence of a fault within the vicinity of the sensor, as the fault causes a reaction at the polymer film. To detect the location of the fault, a voltage is applied across the electrodes, and the current flowing through the electrodes is measured.

20 Claims, 5 Drawing Figures

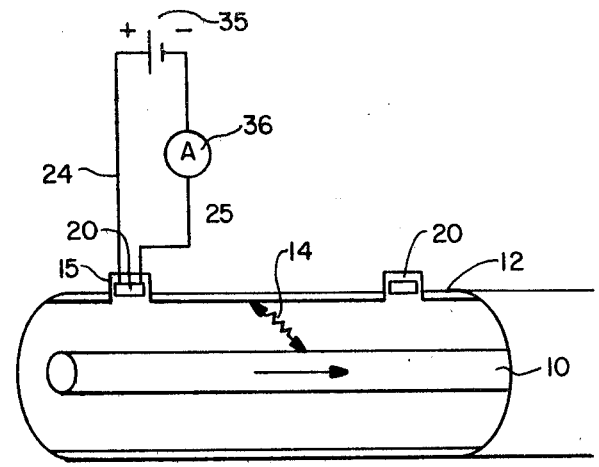
FIG.—1
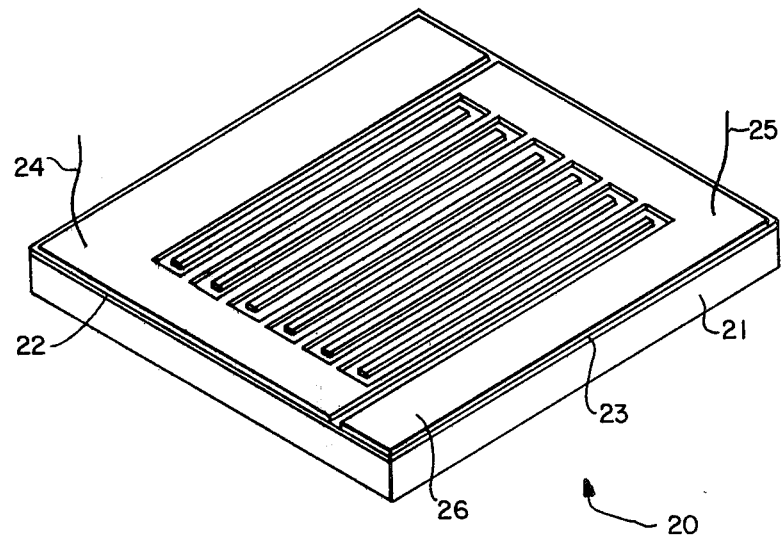
FIG.—2

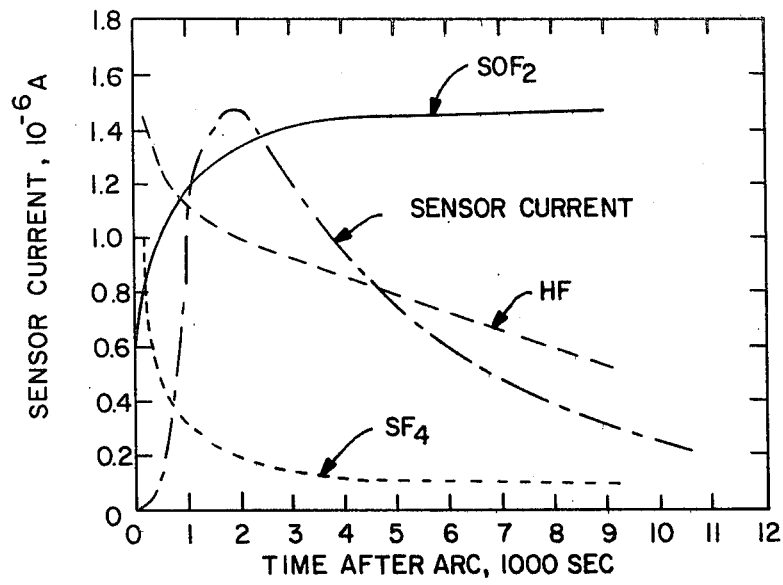
FIG.—3
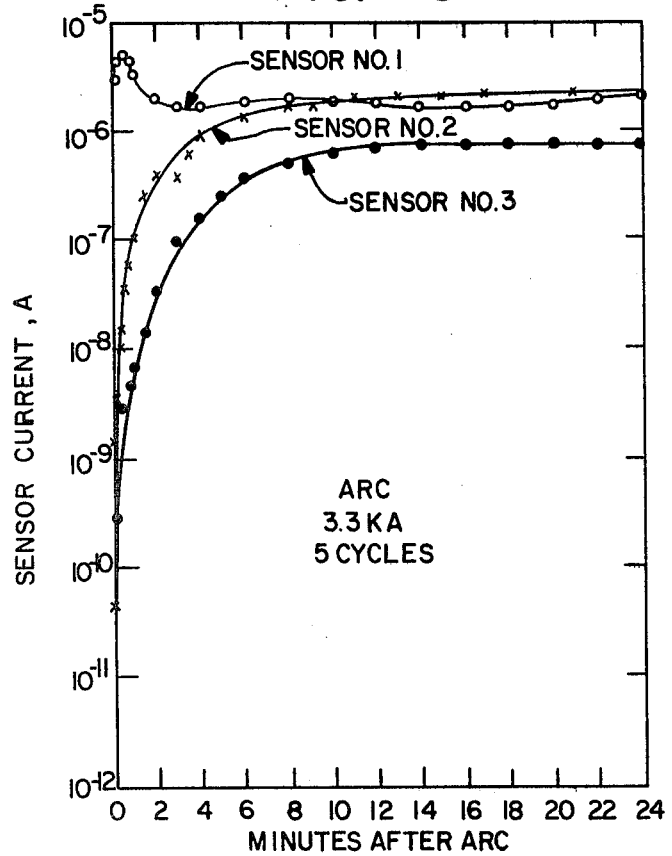
FIG.— 4

RESISTIVITY SENSOR SYSTEM FOR DETECTING FAULTS IN SEALED GAS-INSULATED ELECTRICAL APPARATUS

This invention relates generally to electrical fault sensing systems, and more particularly the invention relates to a sensor system for sensing electrical faults within sealed, gas-insulated electrical power apparatus.

Sealed gas-insulated equipment is finding greater applicability in electric power applications such as in substations. Typically, compressed sulfur-hexafluoride ($SF_6$) gas will be used as the insulating medium. Compactness, improved aesthetics, freedom from electrostatic field, and lower installment costs, especially in EHV and UHV applications, will likely increase the use of such gas insulated equipment.

However, problems are presented in maintaining and servicing such enclosed gas-insulated equipment. In particular, electrical faults such as arcing between the current carrying components and the outer housing are difficult to locate.

Accordingly, an object of the present invention is an improved fault sensor system for use with sealed gas-insulated electric power apparatus.

Another object of the invention is an improved method of locating electrical faults within sealed gas-insulated electrical apparatus wherein a highly sensitive resistive sensor is used.

According to the present invention, a resistivity sensor system for use with sealed, gas-insulated electrical apparatus is provided. This system includes a resistivity sensor for placement within a housing of the electrical apparatus. The sensor itself includes an electrically insulating substrate, a pair of spaced-apart electrodes located on the substrate, and a polymer film in the space between the electrodes wherein the occurrence of a fault within the vicinity of the sensor produces a reaction at the polymer film that causes the electrical resistivity across the polymer film to change. The system further includes means for applying a voltage across the electrodes, and means for measuring the current flowing through the electrodes.

With the occurrence of a fault or arc-over in the vicinity of the sensor, arc by-products will be deposited on the polymer film of the sensor, causing the resistance across the polymer to change. By measuring the current flowing through the electrodes, the fault location may be detected.

The resistivity sensor of the present invention will be described in more detail hereinafter in conjunction with the drawings wherein:

FIG. 1 is a sectional view of a sealed, gas-insulated electrical apparatus in which the present invention may be employed;

FIG. 2 is a perspective view of a sensor useful with the present invention;

FIG. 3 is a plot of the concentration levels of various arc by-products and the current flowing through the sensor of the present invention before and after the occurrence of a fault;

FIG. 4 is a plot of the current flowing through the sensor of the present invention before and after the occurrence of a fault.

Figure 5:
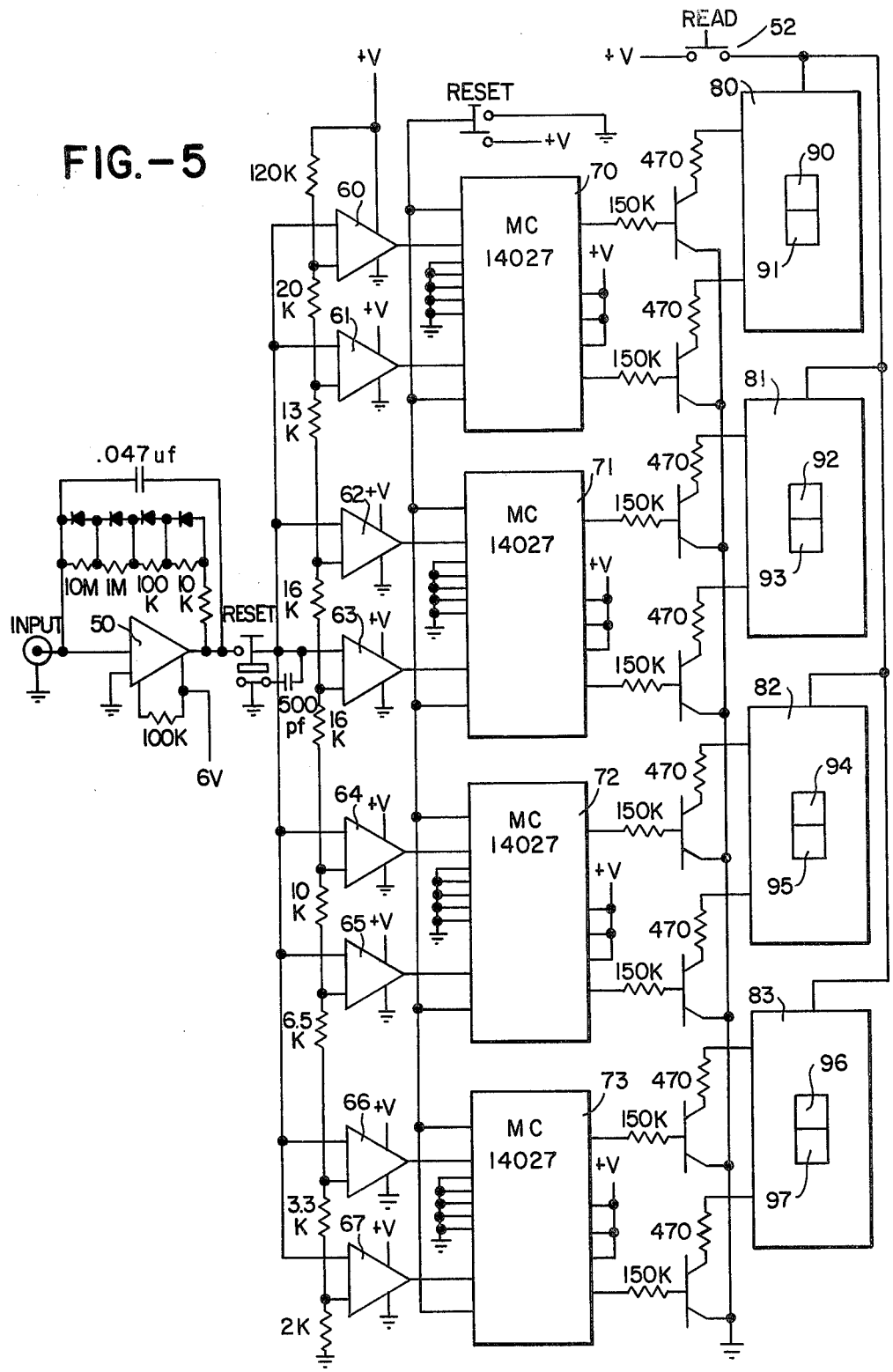
FIG. 5 is an electrical schematic diagram that illustrates a means for indicating that a fault has occurred in the vicinity of a sensor.

Referring now to the drawings, FIG. 1 is a sectional view of a sealed, gas-insulated electrical apparatus in which the present invention may be employed. The apparatus illustrated is a coaxial transmission line in which current flows through an inner conductor 10 which is placed within an outer housing 12 and is insulated therefrom by means of a suitable dielectric medium such as compressed sulphur-hexafluoride ($SF_6$) gas. It is to be understood that the present invention may be used in any other type of gas-insulated electrical apparatus, such as power substation distribution switches.

Upon the occurrence of a fault or arc-over in the electrical apparatus, the current in conductor 10 arcs over to the outer housing 12 as indicated at 14. Such electrical arcing produces fault by-products within the gas in housing 12. The specific by-products generated by an arc in $SF_6$ gas depend on, among other things, the materials in the arcing area, the arc intensity, the arc duration, and the moisture content of the $SF_6$ gas. The primary arc by-product produced is sulfurtetrafluoride ($SF_4$) gas. $SF_4$ is present in very small quantities as compared with the ambient $SF_6$ gas.

In accordance with the present invention, a sensor 20 is provided within housing 12 to detect faults that occur therein. In the preferred embodiment, as shown in FIG. 2, the sensor comprises an electrically insulating substrate 21 with a pair of spaced apart interdigitated electrodes 22 and 23 mounted on one surface of the substrate. Electrical leads 24 and 25 are in contact with electrodes 22 and 23, respectively. The electrical leads are connected to the respective electrodes in any suitable manner. A thin polymer coating or film 26 adheres to the electrode surface, which comrises electrodes 22 and 23 and the surface of the substrate between the electrodes. The polymer is chosen so that its electrical resistivity varies significantly with the occurrence of a fault in the vicinity of the sensor.

In one embodiment, the sensor is square in shape and is 1.27 centimeters long, 1.27 centimeters wide, and 0.07 centimeters thick. The interdigitated electrodes form interelectrode gaps, having a total length of 183 millimeters. The spacing between the electrodes is about 0.20 millimeters. It is to be understood, however, that electrode pair 22 and 23 need not be interdigitated electrodes. They may be any electrode pair of sufficient length in which a gap or space is formed therebetween. Also, the polymer film does not have to cover the electrodes themselves so long as it fills the space between the electrodes.

A variety of electrically insulating substrates may be employed with sensor 20. For instance, the substrate may be a glass-epoxy substrate which is commonly used in making printed circuit boards. The electrodes are formed on the glass-epoxy substrate by having a copper sheet fixed to the substrate wherein the sheet is etched using standard photoetching or photoresist methods to provide the electrode pair.

In the preferred embodiment, the substrate is preferably constructed of high-density alumina. The alumina substrate makes the sensor more sensitive; for a given voltage, it provides higher currents than does the glass-epoxy substrate. With the alumina substrate, the interdigitated electrodes are formed on the substrate by silk-screening a platinum-gold or platinum-copper paste onto the substrate. The substrate is then fired at a high temperature to sinter the electrode material thereon. Of course, various other materials and methods of applying these materials can be used to produce the electrodes on the substrate.

Although various polymers might be used, in the preferred embodiment, the sensor electrode surface is coated with a thin film of polyvinyl pyridine. The resistivity of the polyvinyl pyridine coating is highly dependent upon the presence of arc by-products in the vicinity of the sensor. The resistivity across the polyvinyl pyridine coating decreases significantly when the polymer reacts with arc by-products.

As discussed heretofore, the primary by-product produced when an arc occurs in the $SF_6$ insulating medium is $SF_4$. $SF_4$ is highly reactive. It reacts with water in the insulating medium to produce thionylfluoride ($SOF_2$) and hydrogen fluoride (HF). The $SOF_2$ concentration increases at a rate proportional to the decay rate of the $SF_4$, and, being stable, the $SOF_2$ eventually levels off and becomes constant as the $SF_4$ is consumed. The HF reacts with some component of the apparatus housing. After an initial rise, the HF reaches a peak and then decreases. As shown in FIG. 3, the curve of the current flowing across the sensor electrodes has the same general characteristics as that of the HF concentration but lagging behind it. The electrical resistivity across the sensor's polymer coating is thus seen to be highly dependent upon the presence of arc by-products in the vicinity of the sensor. This dependence presumably arises from the tendency of water molecules in or on the surface of the polymer to react with HF to produce hydrogen ($H^+$) and fluoride ($F^-$) ions.

The polyvinyl pyridine coating may be applied to the sensor by wetting the sensor with a dilute solution of the polymer and allowing the excess to drain off. The solution may comprise one gram of polyvinyl pyridine dissolved in 25 grams of chloroform. The resulting thickness of the polymer coating is on the order of one thousandths of an inch.

FIG. 1 shows the system of the present invention in its simplest form. As illustrated, sensor 20 is suitably attached to the inner surface of housing 12 to be located within the insulating medium, the $SF_6$ gas. Sensor leads 24 and 25 electrically connect the sensor in circuit with a voltage source 35 and an ammeter 36. In the preferred embodiment, between ten and fifty volts DC, although an alternating current source could be used, is applied across the sensor electrodes. The current flowing across the electrodes is measured by the ammeter 36 or some other suitable meter.

Before the occurrence of an arc over, the current flowing through the sensor is very low, typically on the order of $10^{-12}$ to $10^{-14}$ amps. As shown in FIG. 4, which does not show the initial current before the arc, when a fault occurs, the sensor current increases significantly. From the results of the simulated test plotted in FIG. 4, it can be seen that for a 3.3 kiloamp, 5 cycle arc in a 3 meter long section of coaxial transmission line, sensor current No. 2 increased by a factor of $10^6$ from initial value of about $10^{-12}$ amps to about $10^{-6}$ amps. In the plot of FIG. 4, sensor No. 1 was located right at the arc-over location and sensors Nos. 2 and 3 were located about 4 and 8 feet, respectively, from the arc-over location. Arcs of one kiloamp should be easily detected.

In actual use of the sensor system of the present invention, a sensor will be placed in a tube or compartment 15 formed as part of housing 12 of the electrical apparatus so that the sensor is located within housing 12. There will be a plurality of tubes 15 spaced along housing 12. Each of the tubes will contain a sensor. Preferably, the sensors will be spaced from one another only in an axial direction. The distance between the sensors will depend upon the layout of the electrical apparatus in which they are used and the expected magnitude of the arc to be detected. For instance, for a 5 kiloamp, 4 cycle arc, the sensors could be located up to 50 feet apart. For arcs of lesser magnitude, the sensors probably would be located closer together.

Various means may be used to indicate when the sensor current in one of a plurality of sensors increases due to the occurrence of a fault in the vicinity of the sensor. One such means is shown in FIG. 5. In that circuit, the output current of the sensor is first converted by an input amplifier 50 to a voltage that is approximately proportional to the log of the sensor current. This voltage is then fed to eight comparators 60 through 67 whose levels are set by a resistor string. When the set resistance level is reached, the output of the comparator triggers a switch 71 through 73 which allows an LED display 80 through 83 to light when an interrogation switch 52 is pressed. The number of lights 90 through 97 on in the LED display indicates the magnitude of the sensor current.

Although certain specific embodiments of the invention have been described herein in detail, the invention is not to be limited to only such embodiments, but rather only by the appended claims.

What is claimed is:

1. A resistivity sensor system for use with sealed gas-insulated electrical power apparatus to detect faults, comprising:
    a plurality of resistivity sensors positioned within a housing of said electrical power apparatus wherein said sensors are spaced from one another and include
    (i) an electrically insulating substrate,
    (ii) a pair of spaced apart electrodes located on said substrate, and
    (iii) a polymer film in the space between said electrodes wherein the occurrence of a fault in the vicinity of said sensor produces arc by-products that cause a reaction at said polymer film to change the electrical resistivity across said polymer film in accordance with the distance that said sensor is from the location of the fault;
    means for applying a voltage across said electrodes;
    means for measuring current flowing through said electrodes; and
    means responsive to changes in said current flowing through said sensors to indicate which of said sensors is nearest said fault.

2. The sensor system of claim 1 wherein said polymer is polyvinyl pyridine.

3. The sensor system of claim 1 wherein said insulating substrate is constructed of alumina.

4. The sensor system of claim 3 wherein said electrodes are formed by platinum-silver conductor paths.

5. The sensor system of claim 3 wherein said electrodes are formed by platinum-gold conductor paths.

6. The sensor system of claim 1 wherein said substrate is a glass-epoxy material with said electrodes being photoetched thereon.

7. The sensor system of claim 1 wherein said means for applying a voltage across said electrodes includes a direct current voltage source.

8. The sensor system of claim 1 wherein said measuring means is an ammeter.

9. The sensor system of claim 1 wherein the thickness of said polymer film is about 0.001 of an inch.

10. The sensor system of claim 1 wherein said electrodes are interdigitated electrodes.

11. A resistivity sensor system for use with gas-insulated, sealed electrical power apparatus to detect arc-over locations, comprising:
    a plurality of resistivity sensors positioned within a housing of said electrical power apparatus wherein said sensors are spaced from one another and each of said sensors include
    (i) an electrically insulating substrate,
    (ii) a pair of spaced apart interdigitated electrodes formed on a surface of said substrate defining with said substrate an electrode surface, and
    (iii) a polymer coating adhering to said electrode surface wherein the occurrence of a fault in the vicinity of said sensor produces arc by-products that cause a reaction at said polymer coating to vary the electrical resistivity across said polymer coating in accordance with the concentration of arc by-products, produced by an arc-over, present in the vicinity of said sensor;
    means for applying a voltage across said electrodes;
    means for measuring the current flowing through said electrodes to determine the resistance between said electrodes; and
    means responsive to changes in said current flowing through said sensors to indicate which of said sensors is nearest said fault.

12. The sensor system of claim 11 wherein said polymer is polyvinyl pyridine.

13. The sensor system of claim 12 wherein said insulating substrate is constructed of alumina.

14. The sensor system of claim 13 wherein said electrodes are formed by platinum-silver conductor paths.

15. The sensor system of claim 13 wherein said electrodes are formed by platinum-gold conductor paths.

16. The sensor system of claims 14 or 15 wherein the thickness of said polymer coating is about 0.001 of an inch.

17. The sensor system of claim 16 wherein said means for applying a voltage across said electrodes includes a direct current voltage source.

18. A method of detecting faults in gas-insulated, sealed electrical apparatus, comprising:
    positioning a plurality of resistivity sensors within a housing of said electrical apparatus to be spaced from one another wherein each of said sensors includes a spaced apart pair of electrodes located on an insulating electrical substrate, a polymer coating adhering to said electrodes and the space therebetween, the occurrence of a fault in the vicinity of said sensors producing arc by-products that cause a reaction at said polymer coating to cause a change in the resistivity across said polymer coating;
    applying a voltage across said electrodes;
    measuring the current flowing through said electrodes; and
    determining which of said sensors is nearest said fault based upon the change in current flow through said sensors.

19. The method of claim 18 wherein said polymer is polyvinyl pyridine.

20. The method of claim 18 wherein a direct current voltage source is applied across said electrodes.

* * * * *